US011182250B1

(12) United States Patent
Xiang et al.

(10) Patent No.: US 11,182,250 B1
(45) Date of Patent: Nov. 23, 2021

(54) SYSTEMS AND METHODS OF RESYNCING DATA IN ERASURE-CODED OBJECTS WITH MULTIPLE FAILURES

(71) Applicant: VMware, Inc., Palo Alto, CA (US)

(72) Inventors: Enning Xiang, San Jose, CA (US); Wenguang Wang, Santa Clara, CA (US); Vamsi Gunturu, Palo Alto, CA (US)

(73) Assignee: VMware, Inc., Palo Alto, CA (US)

( * ) Notice: Subject to any disclaimer, the term of this patent is extended or adjusted under 35 U.S.C. 154(b) by 0 days.

(21) Appl. No.: 16/920,005

(22) Filed: Jul. 2, 2020

(51) Int. Cl.
  *G06F 11/10* (2006.01)
  *G06F 11/16* (2006.01)
  *G06F 11/14* (2006.01)
  *G11C 29/00* (2006.01)

(52) U.S. Cl.
  CPC ...... *G06F 11/1076* (2013.01); *G06F 11/1068* (2013.01); *G06F 11/1471* (2013.01); *G06F 11/1658* (2013.01); *G11C 29/78* (2013.01)

(58) Field of Classification Search
  CPC ............. G06F 11/1004; G06F 11/1008; G06F 11/1012; G06F 11/1076; G06F 11/1084; G06F 11/1088; G06F 11/1096; G06F 3/0619; G06F 3/0644; G06F 3/0689
  See application file for complete search history.

(56) References Cited

U.S. PATENT DOCUMENTS

| | | | | |
|---|---|---|---|---|
| 2003/0145270 A1* | 7/2003 | Holt | ................... | G11B 20/1833 714/766 |
| 2007/0180348 A1* | 8/2007 | Corbett | ............... | G06F 11/1076 714/770 |
| 2008/0168225 A1* | 7/2008 | O'Connor | ........... | G06F 11/1088 711/114 |
| 2008/0282105 A1* | 11/2008 | Deenadhayalan | .. | G06F 11/1076 714/6.12 |
| 2009/0083504 A1* | 3/2009 | Belluomini | ......... | G06F 11/1076 711/162 |
| 2012/0084505 A1* | 4/2012 | Colgrove | ............ | G06F 11/3034 711/114 |
| 2015/0095697 A1* | 4/2015 | Bonwick | ................. | G06F 3/064 714/6.24 |
| 2017/0242587 A1* | 8/2017 | Blaum | .................. | G06F 3/0638 |

* cited by examiner

*Primary Examiner* — Bryce P Bonzo
*Assistant Examiner* — Albert Li
(74) *Attorney, Agent, or Firm* — Fish & Richardson P.C.

(57) ABSTRACT

Methods, systems, and apparatus, including computer programs encoded on computer storage media, for resynchronizing data in a storage system. One of the methods includes determining that a particular disk of a capacity object of a storage system is out-of-sync and that a primary disk is unavailable; and for each segment of one or more segments of the capacity object: generating a first version of the column of the segment corresponding to the unavailable primary disk; determining whether the data integrity token in the column summary of the generated first version is valid; and in response to determining that the data integrity token is valid, resynchronizing the column of the segment corresponding to the particular disk using i) the primary columns of the segment corresponding to each available primary disk and ii) the first version of the column of the segment corresponding to the unavailable primary disk.

21 Claims, 6 Drawing Sheets

SYSTEMS AND METHODS OF RESYNCING DATA IN ERASURE-CODED OBJECTS WITH MULTIPLE FAILURES

BACKGROUND

This specification generally relates to data storage virtualization.

A common architecture for data storage virtualization is a redundant array of independent disks (RAID), where multiple disk drives, also called simply "disks," are combined into a single logical unit for the purpose of data redundancy. There are multiple different RAID levels that each define a different procedure for distributing data across the multiple disks.

One common RAID level is RAID-1, where every item of data written to the storage system is copied, or "mirrored," at least once. For example, there might be two disks in a RAID-1 array, where all of the data written to the first disk is mirrored to the second disk. Thus, every disk except one in a RAID-1 array can fail and the system can restore the data without data loss. This fault tolerance comes at the cost of space efficiency and write efficiency. That is, with n disks, a RAID-1 array has a usable capacity of $1/n^{th}$ the capacity of the array, and every write operation requires n operations to amplify the write across the array.

Another common RAID level is RAID-6, where multiple "primary" disks store data that is supported by two "parity" disks. A parity disk provides fault tolerance to the primary disks, so that if a primary disk fails, a system can restore the data of the failed primary disk without data loss. Typically there are two parity disks in a RAID-6 array, which allows for up to two disk failures, across the primary disks and the parity disks, without loss of data. A RAID-6 array employs block-level striping, where each disk is segmented into multiple blocks, and where logically sequential blocks are stored on different disks. The group of corresponding blocks in each of the disks of a RAID-6 array is called a "stripe," and the size of a single block is called the "stripe size" of the array.

As with RAID-1, the fault tolerance of RAID-6 comes at the cost of lower capacity and write efficiency. For instance, a RAID-6 array might have 4 primary disks and 2 parity disks. In this case, the usable capacity of the array is $2/3^{rd}$ the capacity of the array. To write to a single block of a primary disk of the array requires 6 read and write operations: the system must i) read the current value of the block of the primary disk and the current values of the corresponding blocks of the two parity disks, ii) compute an update to the values of the blocks of the parity disks given the new data in block of the primary disk, and iii) write the new data to the block of the primary disk and the new values to the blocks of the two parity disks.

In some RAID-6 implementations, a storage system can improve the write efficiency of the array by executing a "full-stripe write," where the system writes data to every block in a stripe at once. In the example where there are 4 primary disks and 2 parity disks, a single full-stripe write only requires 1.5× operations, i.e., writing data to the 4 blocks of the primary disks requires writing to the 2 blocks of the parity disks.

SUMMARY

This specification generally describes a storage system architecture that uses a meta object and a capacity object to execute full-stripe writes of user data to the capacity object.

In particular, an external system, e.g., a user or user system, can store data by sending a write request to the meta object of the storage system. The meta object can store the data until the amount of data stored by the meta object, cumulatively across one or more different write requests, exceeds a certain threshold. Once the threshold is exceeded, the meta object can execute one or more full-stripe writes to the capacity object. If a portion of the data in the full-stripe write is replacing old data that is already stored in the capacity object, then instead of overwriting the old data in an inefficient single-block write, the capacity object can execute the full-stripe write and update a logical map that tracks the location of the most recent version of each piece of data. Then, when an external system submits a read request for the data, the capacity object can determine, using the logical map, the location of the most recent version of the requested data, and retrieve the requested data and provide it to the external system.

The capacity object can include multiple primary disks and multiple parity disks. For example, the capacity object can be a RAID-6 array with two parity disks.

In this specification, a disk is "out-of-sync" if the disk needs to be resynchronized. For example, an out-of-sync disk could be a disk that went offline for a period of time and has come back online. As a result, it is possible that the disk has stale or incorrect data, and therefore the disk needs to be resynchronized. As another example, an out-of-sync disk could be a disk for which an issue has been discovered with the data on the disk; e.g., the storage system discovered that a segment summary of the disk does not match the data of the corresponding segment of the disk, and therefore the disk needs to be resynchronized. As another example, an out-of-sync disk could be a disk for which the data on the disk has been lost completely, and therefore the disk needs to be resynchronized to recover the entire disk information.

In this specification, a first disk is "unavailable" if the disk cannot be used by a resynchronization system to resynchronize a second disk; that is, the first disk is "unavailable" to the resynchronization system. For example, an unavailable disk could be a disk that is out-of-sync; that is, a first disk that has unsynchronized data cannot be used to resynchronize a second disk. As another example, an unavailable disk could be a disk that is currently offline. In this specification, a disk is "available" if the disk is not "unavailable."

When one of the disks of the capacity object is out-of-sync, and one of the primary disks is unavailable, the storage system can execute a resynchronization technique that ensures data integrity. In particular, the storage system can reconstruct the data that should be stored in the out-of-sync disk using the available primary disks of the capacity object and one or more of the parity disks of the capacity object.

In some cases, the out-of-sync disk is a parity disk of the capacity object. In these cases, the system can generate a version of the unavailable primary disk using i) the available primary disks of the capacity object and ii) a different parity disk of the multiple parity disks that is not the failed parity disk. For example, in a RAID-6 array where primary disk A is unavailable and parity disk P is out-of-sync, the system can first generate a resynchronized version of primary disk A using the available primary disks B, C, and D and parity disk Q. The system can then verify that the data in the generated version of the unavailable primary disk is valid using a segment summary of the generated version. The segment summary of a primary disk can be stored at the end of the primary disk, and summarizes the data stored in the rest of the primary disk, including storing a data integrity token corresponding to the rest of the primary disk. If the data in the generated version of the unavailable primary disk is valid, then the system can resynchronize the out-of-sync parity disk using i) the generated version of the unavailable primary disk and ii) the other primary disks. Continuing the example above, out-of-sync parity disk P can be resynchronized using available primary disks B, C, and D and the generated resynchronized version of the unavailable primary disk A.

In this specification, a system "generates" a resynchronized version of a disk, or a resynchronized version of a segment of a disk, when the system determines up-to-date and correct values for the data in the disk, or segment of the disk. The generated version of the disk, or segment of the disk, can be stored in the memory of the system and does not have to be placed into the disk. For example, if the disk is still offline, then the system might not place the generated version of the data of the disk onto the disk, and instead wait until the disk comes back online to execute a full resynchronization process for the disk. In this specification, a system "resynchronizes" a disk, or a segment of a disk, when the system determines up-to-date and correct values for the data in the disk, or segment of the disk, and then places the determined data into the disk, thereby establishing the determined data to be the data of the disk.

Particular embodiments of the subject matter described in this specification can be implemented so as to realize one or more of the following advantages.

Using techniques described in this specification, a storage system can exclusively, or almost exclusively, perform full-stripe writes to an array of primary and parity disks, e.g., a RAID-6 array. Compared to performing single-block writes, full-stripe writes can reduce latency of the storage system and can be significantly more computationally efficient.

Using techniques described in this specification, a storage system can write data to a RAID-6 array without having to perform a second write for a checksum of the data. Rather, the storage system can create, using the same write request that writes the data to the RAID-6 array, a segment summary that the system can use to verify the correctness of the data.

Using techniques described in this specification, a data recovery subsystem can resynchronize a disk of the described storage system that is out of sync when another disk of the storage system is unavailable, without data loss and without using a checksum that is stored separately from the disk, when one of the primary disks of the storage system has failed or contains incorrect data. When resynchronizing an out-of-sync primary disk or generating a version of an unavailable primary disk, the data recovery subsystem can use information stored in a segment summary that a storage system can generate using the same write request as the data of the primary disk itself to determine a correct version of the primary disk.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes techniques for resynchronizing data in a storage subsystem.

Figure 1:
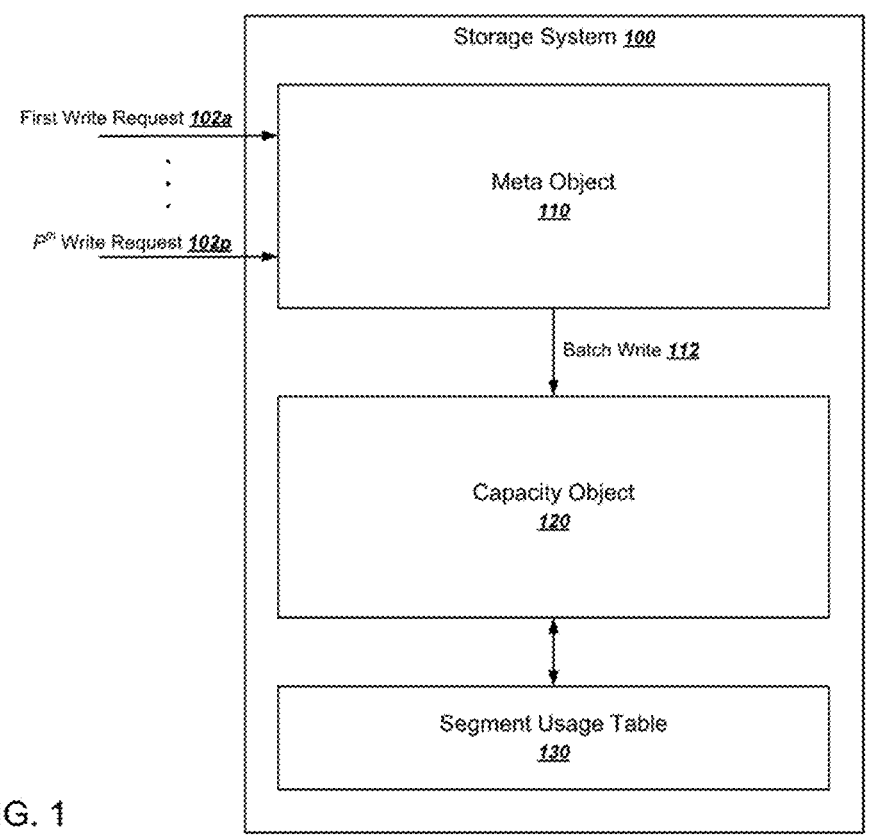
FIG. 1 is a diagram of an example storage system.

FIG. 1 is a diagram of an example storage system 100. The storage system 100 includes a meta object 110, a capacity object 120, and a segment usage table 130.

The storage system 100 is configured to receive requests to write data to the storage system 100. For example, the storage system might receive p write requests 102a-p, each associated with a different piece of data that is to be stored in the storage system 100. The write requests 120a-p can be received from a computing device, e.g., from a user device or from a virtual machine on behalf of a user or user system.

Each time the storage system 100 receives a write request 102i, the data associated with the write request 102i is written to the meta object 110, e.g., into a RAID-1 array in the meta object 110. When the amount of data that has been written to the meta object 110, cumulatively over one or more different write requests, surpasses a particular threshold, then the meta object can execute a batch write 112 to the capacity object that includes all of the data that has been written to the meta object 110 since the previous batch write 112. That is, the meta object 110 sends all of the data it has received across one or more write requests 102a-p to the capacity object 120. In some cases, the meta object 110 can then erase the data in order to receive more write requests 102i. Typically the capacity object 120 is significantly larger than the meta object 110, e.g., 10×, 100×, or 1000× as large. Meta objects are discussed in more detail below in reference to FIG. 2.

The capacity object 120 can receive the batch write 112 and write the data for long-term storage, e.g., write the data to a RAID-6 array in the capacity object. The batch write 112 can be a full-stripe write to the RAID-6 array in the capacity object. If the batch write 112 includes new data that is to replace older data that is already stored in the capacity object 120, the capacity object 120 can execute a new full-stripe write and update a logical map that identifies the current location of every stored data item, instead of executing one or more single-block writes to overwrite the older data. Capacity objects are discussed in more detail below in reference to FIG. 3.

The capacity object 120 can include multiple "segments." That is, each disk of the capacity object 120 can be segmented into blocks of consecutive addresses, with corresponding blocks in each disk constituting a segment of the capacity object 120. When the capacity object 120 executes the batch write 112, some of the data in the batch write 112 might replace older data that is stored in other segments of the capacity object 120. After the capacity object 120 executes the batch write 112 and updates the logical map, the older data in the other segments is considered "stale." Stale data is data that has since been replaced with newer data in the logical map but that has not yet been erased or overwritten. Conversely, "live" data is data that is still in use, i.e., that still represents the latest version of the data.

The segment usage table 130 can track how much data in each segment of the capacity object 120 is live and how much is stale. That is, for each segment in the capacity object 120, the segment usage table 130 can identify i) how much of the data is still being used by the system that submits the write requests 120*a-p*, and ii) how much of the data has since been replaced with newer data stored in another segment. Segment usage tables are discussed in more detail below in reference to FIG. 4.

Figure 2:
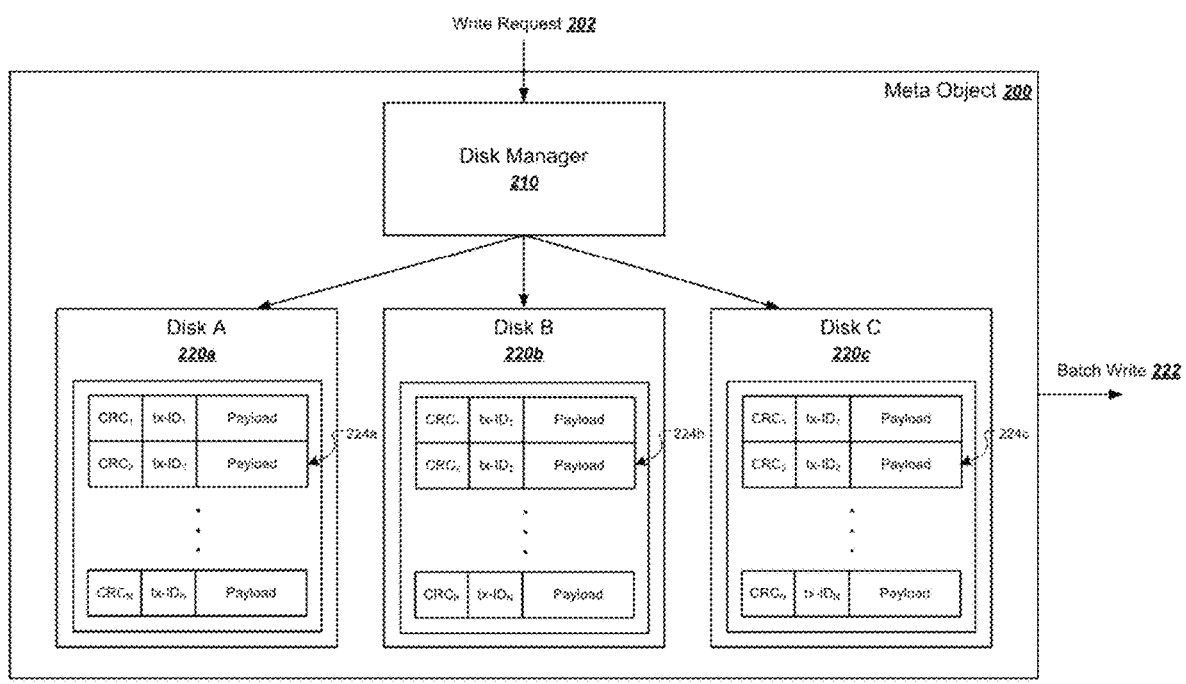
FIG. 2 is a diagram of an example meta object.

FIG. 2 is a diagram of an example meta object 200. The meta object 200 can be part of a storage system, e.g., the storage system 100 shown in FIG. 1, that includes the meta object 200 and a capacity object. The meta object 200 includes a disk manager 210 and three disks 220*a-c*. In some implementations, the three disks 220*a-c* are mirrored disks that make up a RAID-1 array.

The meta object 200 is configured to receive a write request 202 to write data to the storage system. The disk manager 210 can write the data to each of the disks 220*a-c*. This provides redundancy so that if any two of the disks fail, the meta object 200 can still recover the data. Moreover, the meta object 200 can resynchronize the failed disk when it comes back online.

Each time the disk manager 210 writes data to the disks 220*a-c*, the disk manager can write a copy of the same meta data block to each disk 220*a-c*, e.g., copies 224*a-c* of meta data block 224. Each meta data block can include a data integrity check, a transaction ID, and the data payload itself. The meta object 200 can use the data integrity check (e.g., a checksum value such as a cyclic redundancy check (CRC) value, a hash value, or a data fingerprint value) to ensure that the payload has not been corrupted. The transaction ID can identify the time at which the disk manager 210 wrote the data to the disk; that is, transaction IDs can be strictly increasing with time. The data payload can include the data that is associated with the write request 202.

The meta object 200 can receive a write request 202 that replaces data that is already stored in the meta object 200; that is, the write request 202 can indicate that some or all of the data in the write request 202 represents an update to particular data that i) was in a previous write request received by the meta object and ii) is still stored in the meta object 200. In some implementations, the meta object 200 can overwrite stale data using the new data in the latest write request 202. That is, for each disk 220*a-c*, the meta object can identify one or more meta data blocks that store data that is now stale, and can i) replace the payload using the newest data, ii) update the CRC using the new payload, and iii) update the transaction ID to reflect the time at which the data was updated.

When the meta object 200 receives a cumulative amount of data, across one or more write requests 202, that exceeds a particular threshold, then the meta object 200 can execute a batch write 222 to the capacity object of the storage system, sending each meta data block stored in the meta object 200 to the capacity object. In some implementations, the meta object 200 can perform one or more integrity checks on the data before performing the batch write 222. For example, the meta object 200 can determine, for each meta data block, whether the data stored in the three disks 220*a-c* is the same. As another example, the meta object 200 can determine, for each meta data block, if the data integrity check of the meta data block matches the associated data payload.

After sending the batch write 222 to the capacity object, the meta object 200 can free the storage space formerly used to store the corresponding meta data blocks of the batch write 222 to write new data associated with new write requests 202. For example, the meta object 200 can delete the corresponding meta data blocks from the three disks 220*a-c*. As another example, the meta object 200 can mark the corresponding meta data blocks as available to be overwritten by new data.

Figure 3A:
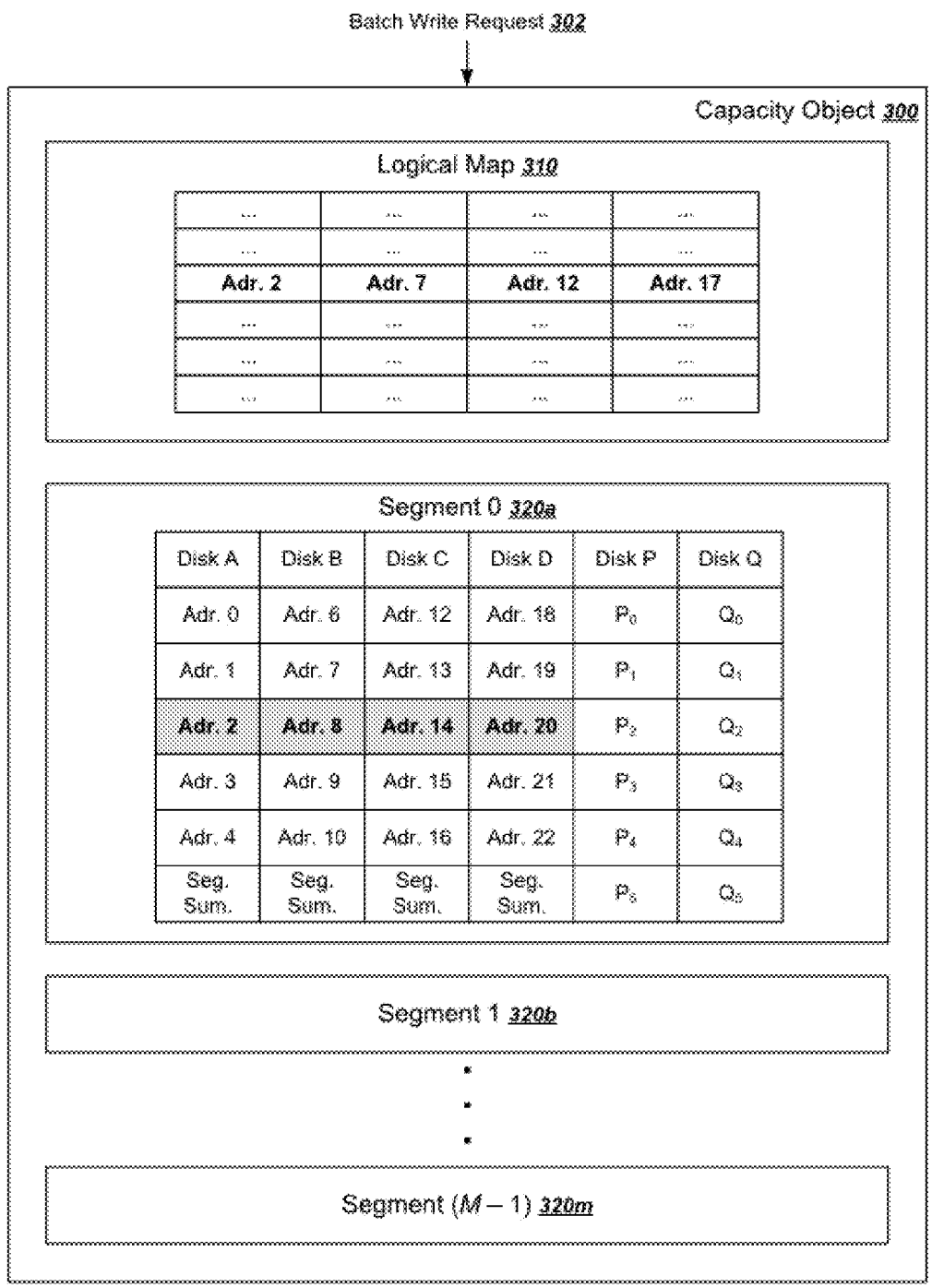
FIGS. 3A and 3B are diagrams of an example capacity object.
Figure 3B:
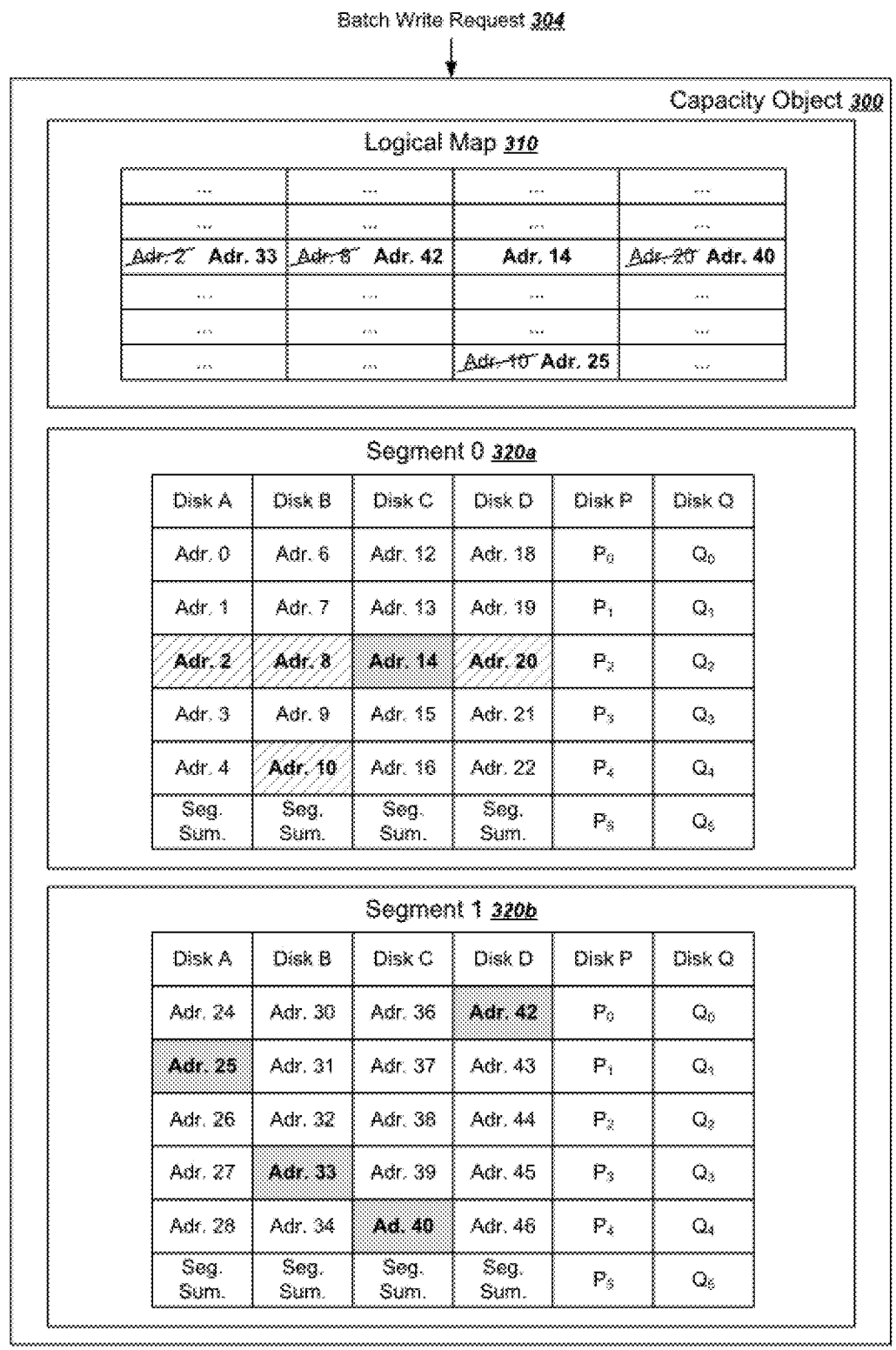

FIGS. 3A and 3B are diagrams of an example capacity object 300. The capacity object 300 can be part of a storage system, e.g., the storage system 100 depicted in FIG. 1, that includes a meta object and the capacity object 300.

The capacity object 300 includes a logical map 310 and M segments 320*a-m*. In the example shown in FIGS. 3A and 3B, the M segments 320*a-m* are segments of six disks in a RAID-6 array, where four of the six disks (disks A, B, C, and D) are primary disks and two of the six disks (disks P and Q) are parity disks. That is, each segment 320*i* represents a list of consecutive addresses of the six disks. As a particular example, each segment can include 768 KB total storage space, including 128 KB in each of the six disks. In this example, each segment has 512 KB of usable storage space, i.e., 128 KB in each of the primary disks.

In some implementations, the four of the six disks that are used as primary disks and the two of the six disks that are used as parity disks are "cycled" in each segment of the capacity object 300. That is, the capacity object 300 can use a portion of a disk corresponding to a first segment to store primary data, and a different portion of the same disk corresponding to a second segment to store parity data. In some other implementations, the capacity object 300 can use the same four disks as primary disks and the same two disks as parity disks for all segments of the capacity object 300.

As illustrated in the example of FIG. 3A, the capacity object 300 is configured to receive a batch write request 302 to store data in the capacity object 300. For example, the batch write request 302 can come from a meta object of the storage system of the capacity object 300, e.g., the meta object 200 depicted in FIG. 2. In some implementations, each batch write request includes the same amount of data as can be stored in a single segment 320*i*; that is, the stripe size of the capacity object 300 is equal to the size of a segment 320*a-m*. In some other implementations, each batch write request includes the same amount of data as can be stored in one stripe of a segment 320*i*; that is, the stripe size of the capacity object 300 is less than the size of a segment 320*a-m*. In any case, the capacity object 300 can be configured to receive batch write requests that represent full-stripe writes, which, as discussed above, is more efficient than writing to individual blocks of respective disks of a segment.

Upon receiving the batch write request 302, the capacity object 300 can determine the segment to which to write the data associated with the batch write request 302. For example, the capacity object 300 can use a segment usage table that identifies which segments are available to receive new data. Segment usage tables are discussed in more detail below in reference to FIG. 4.

In the example illustrated in FIG. 3A, the capacity object 300 can determine to write the data to the first segment 320*a*. That is, the capacity object 300 can place the data associated with the batch write request 302 into the storage addresses of the first segment 320*a*. As a particular example, segments 0 through (M−1) could all be empty, and thus the capacity object 300 selects the first available segment, namely the first segment 320*a*. As another particular example, the first segment 320*a* could be completely or partially available after the first segment 320*a* was reclaimed through garbage collection; that is, a garbage collection system of the capacity object 300 could have determined that the data in the first segment 320*a* was stale, and removed the stale data or marked it as available to be overwritten.

In some implementations, the capacity object 300 places the data into a physical storage space corresponding to segment 320a. In some other implementations, the first segment 320a is itself a virtual storage space managed by a lower-level system, and so the capacity object 300 provides the data to the lower-level system that manages the corresponding physical storage space. While only five stripes of the first segment 320a are illustrated in FIG. 3A, in practice the first segment 320a can have many more stripes.

In some implementations, when the capacity object 300 places the data into the first segment 320a, the capacity object 300 can also compute the values for the parity disks P and Q. That is, the batch write request 302 can include only the primary data that is to be placed into disks A, B, C, and D, which the capacity object 300 can process to determine the parity values that are to be placed into disks P and Q. In some other implementations, the batch write request 302 includes the parity values to be stored in disks P and Q.

The capacity object 300 can further generate a segment summary for each disk. The segment summary for a primary disk describes the data that is in the portion of the primary disk corresponding to the segment. For example, the segment summary can include a data integrity check, e.g., a CRC value, a hash of the data in the segment, a size of the segment, etc. Typically, this metadata takes up a small amount of space compared to the segment itself, e.g. 0.1%, 0.5%, 1%, 5%, 10%, or 20% of the storage space. In some implementations in which the stripe size of the capacity object 300 is equal to the size of each segment 320a-m, the capacity object 300 computes the segment summaries of a particular segment each time the capacity object 300 executes a full-stripe write to the particular segment. In some other implementations in which the stripe size of the capacity object 300 is less than the size of each segment 320a-m, the capacity object 300 can re-compute the segment summaries of a particular segment each time the capacity object 300 executes a full-stripe write to the particular segment, using the data in each of the stripes of the segment. The segment summary for a parity disk can be the parity values calculated from the segment summaries of the primary disks. The capacity object can store segment summaries of a particular segment in addresses of the particular segment. For example, as depicted in FIG. 3A, the capacity object stores the segment summaries in addresses 5, 11, 17, and 23 of the first segment 320a.

The logical map 310 characterizes, for each piece of data included in the batch write requests received by the capacity object 300, the location of the piece of data in a respective segment of the capacity object 300. In the example depicted in FIGS. 3A and 3B, there is a single logical map 310 that applies to every segment 320a-m in the capacity object 300. In some implementations, the logical map 310 is stored in 'logical map pages' of the capacity object 300. In some other implementations, the logical map 310 is stored in a meta object of the storage system of the capacity object 300.

The logical map 310 is a map between i) the logical addresses of the capacity object 300, i.e., the addresses that are exposed to a system that retrieves data from the capacity object 300, and ii) the physical addresses of the segments of the capacity object 300. As noted above, in some implementations, the physical addresses of the capacity object 300 are themselves logical addresses of a lower-level system that manages the actual physical machines that store the data. For clarity, the logical map 310 in FIGS. 3A and 3B is depicted as a table. However, in general, the storage system can store the logical map 310 as any indexing structure that can map the logical addresses of the capacity object 300 to physical addresses. As a particular example, the storage system can store the logical map 310 as a B-tree.

Thus, when a batch write 302 includes new data that is to replace existing data that is already being stored in the capacity object 300, the capacity object does not have to execute a single-block write to the physical addresses of the segment 320i that is currently storing the existing data, which can be computationally expensive. Instead, the capacity object 300 can execute a full-stripe write of all of the data in the batch write request 302 to a new segment of the capacity object 300, and simply update the logical map 310 to list the new location of the data instead of the existing location of the data.

In the example illustrated in FIG. 3A, all of the data in the batch write request 302 is new data—that is, the data in the batch write request 302 is not replacing data that is already stored in the capacity object 300. Therefore, the capacity object can generate new entries in the logical map 310 that identify where the new data is located in the capacity object 300. In particular, the capacity object 300 can execute a full-stripe write that writes new data to the physical addresses 2, 8, 14, and 20 of the first segment 320a, and generate entries in the logical map 310 that maps the logical addresses of the new data to those addresses.

In some implementations, e.g., in the implementations in which the stripe size of the capacity object 300 is equal to the size of each segment 320a-m, the capacity object 300 executes a full-stripe write to the entire first segment 320a, i.e., writing to each address 0 through 22.

In some alternative implementations in which the stripe size of the capacity object 300 is less than the size of each segment 320a-m, the capacity object 300 executes full-stripe writes in chronological order of the stripes in a segment. That is, when the capacity object 300 executes the full-stripe write to the stripe composed of addresses 2, 8, 14, and 20, the first segment 320a includes live data in the stripe composed of addresses 1, 7, 13, and 19 but does not include live data in the stripe composed of addresses 3, 9, 15, and 21. Then, when the capacity object 300 receives a new batch write request 302, the capacity object 300 might write to the stripe composed of addresses 3, 9, 15, and 21.

In some other implementations in which the stripe size of the capacity object 300 is less than the size of each segment 320a-m, the capacity object 300 does not necessarily execute full-stripe writes in chronological order of the stripes in a segment. That is, when the capacity object 300 executes the full-stripe write to the stripe composed of addresses 2, 8, 14, and 20, the first segment 320a might not include live data in the stripe composed of addresses 1, 7, 13, and 19, and/or might include live data in the stripe composed of addresses 3, 9, 15, and 21. For example, if the first segment 320a was partially reclaimed by a garbage collection system if the capacity object 300, the stripe composed of addresses 2, 8, 14, and 20, might have been reclaimed and thus does not include any live data, but the stripe composed of addresses 3, 9, 15, and 21 might not have been reclaimed and thus does include live data.

As depicted FIG. 3B, the capacity object 300 can receive another batch write request 304. As before, the capacity object 300 can determine the segment to which to write the data associated with the batch write request 304. In the example illustrated in FIG. 3B, the capacity object 300 can determine to write the data to the second segment 320b. Note that, in general, the capacity object 300 does not have to write to segments sequentially; that is, the capacity object 300 could have written to any segment of the capacity object 300 after writing to the first segment 320a.

In the example illustrated in FIG. 3B, the batch write request 304 includes four blocks of data that are to replace existing blocks of data. Namely, the batch write request 304 includes three blocks of data that are to replace the data of batch write request 302 previously written to addresses 2, 8, and 20. Additionally, the batch write request 304 includes a block of data that is to replace data previously written to address 10 in the first segment 320a.

Therefore, when the capacity object 300 writes the data associated with the batch write request 304 to the second segment 320b, the capacity object 300 also updates the logical map 310 to identify the four new locations for the new blocks of data that replace the existing blocks of data. Namely, the logical map now identifies the addresses 33, 42, 25, and 40 of the second segment 320b as the new location for the four blocks of data, replacing the addresses 2, 8, 10, and 20 of the first segment 320a. The data stored in addresses 2, 8, 10, and 20 of the first segment 320a is not erased or overwritten in the example depicted in FIG. 3B; rather, it simply become "stale." The capacity object 300 might track the fact that these addresses have become stale in a segment usage table of the capacity object 300. Segment usage tables are discusses in more detail below in reference to FIG. 4.

Note that the new data does not have to be stored sequentially in the second segment 320b, even though it may be sequential in the logical map 310. That is, the new data can be only a portion of the data in the batch write request 304, so that the capacity object 300 can write other data in between the new data (e.g., data in addresses 34, 36, etc. between addresses 33 and 42 even though addresses 33 and 42 are sequential in the logical map 310).

Note also that the new data does not have to be written to the same disk as the stale data that is replaces (e.g., the data that replaces address 2 of Disk A is written to address 33 of Disk B).

Executing the batch write request 304 in the way described above can be much more efficient than individually overwriting each stale piece of data in the first segment 320a with the corresponding new piece of data. For example, overwriting the data in address 10 of the first segment would require the capacity object 300 to read the full corresponding stripe between address 4 and $Q_4$, compute new parity values for $P_4$ and $Q_4$ using the new data, and rewrite the stripe. Additionally, the capacity object 300 might have to read, update, and rewrite the segment summary of Disk B to reflect the new value in address 10. Using the technique described above, the capacity object 300 can write the new data in a single full-stripe write, and simply update the logical map 310 to reflect the change.

After the capacity object 300 updates the logical map 310 and executes the batch write request 304, if an external system submits a request to retrieve the four updated blocks of data, the capacity object 300 can determine, from the logical map 310, the locations of the most recent versions of the data (namely, addresses 33, 42, 25, and 40 of the second segment 320b) and retrieve the data from the determined locations.

Figure 4:
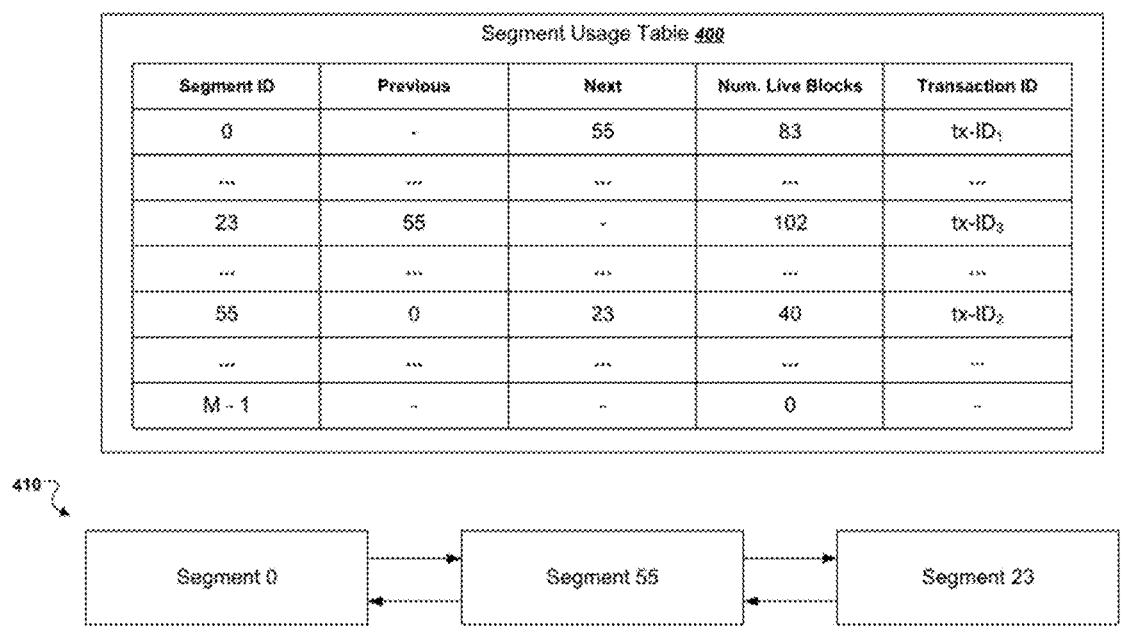
FIG. 4 is a diagram of an example segment usage table.

FIG. 4 is a diagram of an example segment usage table 400. The segment usage table 400 can be part of a storage system, e.g., the storage system 100 depicted in FIG. 1, that includes a meta object and a capacity object, where the availability of the respective segments of the capacity object is characterized by the segment usage table 400.

The segment usage table 400 includes a row for each segment of the capacity object of the storage system. For each segment, the corresponding row lists i) a previous segment in a linked list of segments 410, ii) a next segment in the linked list of segments 410, iii) a number of live blocks, and iv) a transaction ID. The linked list of segments 410 includes every segment that currently stores "live" data, i.e., data that has not since been updated in a more recent write to a later segment in the linked list of segments of the capacity object.

In the example illustrated in FIG. 4, there are three segments of the capacity object corresponding to the segment usage table 400 that have live data: segment 0, segment 55, and segment 23. The "Num. Live Blocks" value for each segment in the linked list of segments 410 identifies the number of blocks in the segment that have live data; namely, segment 0 has 83 live blocks, segment 23 has 102 live blocks, and segment 55 has 40 live blocks. The "Transaction ID" value for each segment identifies the time at which the segment was most recently written to, i.e., how old the newest data in the segment is. Because the storage system generally executes full-stripe writes to segments, the newest data in a segment is the data in the final stripe of the segment. The transaction IDs in the linked list of segments 410 are strictly increasing, because the linked list 410 defines the order in which the segments have been written to; therefore, the transaction ID of segment 0 is smaller than the transaction ID of segment 55, which is smaller than the transaction ID of segment 23.

When the capacity object receives a new write request associated with new data, the capacity object can use the segment usage table 400 to identify the segment in which to store the new data. For example, when the stripe size of the capacity object is equal to the size of each segment, the capacity object can select a segment that is not currently in the linked list of segments 410, i.e., a segment that currently does not have any live blocks. In the example illustrated in FIG. 4, the $M^{th}$ segment is not in the linked list and therefore has 0 live blocks. As a result, the capacity object can write the new data to segment M and add segment M to the linked list 410.

As another example, when the stripe size of the capacity object is less than the size of each segment, the capacity object can select a segment that is already in the linked list of segments (i.e., that has one or more live blocks) and that has more available blocks than are needed to store the new data, and write the new data to the selected segment. Generally, the selected segment includes full stripes of data that are available (i.e., full stripes that include no live data), and so the capacity object executes full-stripe writes of the new data to the selected segment. In this case, the capacity object can update the number of live blocks in the selected segment, and reorder the linked list 410 to reflect the fact that the selected segment is the most recent segment to have been updated; that is, if the selected segment was not the final segment in the linked list before writing the new data, then the capacity object can place the selected segment at the end of the linked list.

Figure 5:
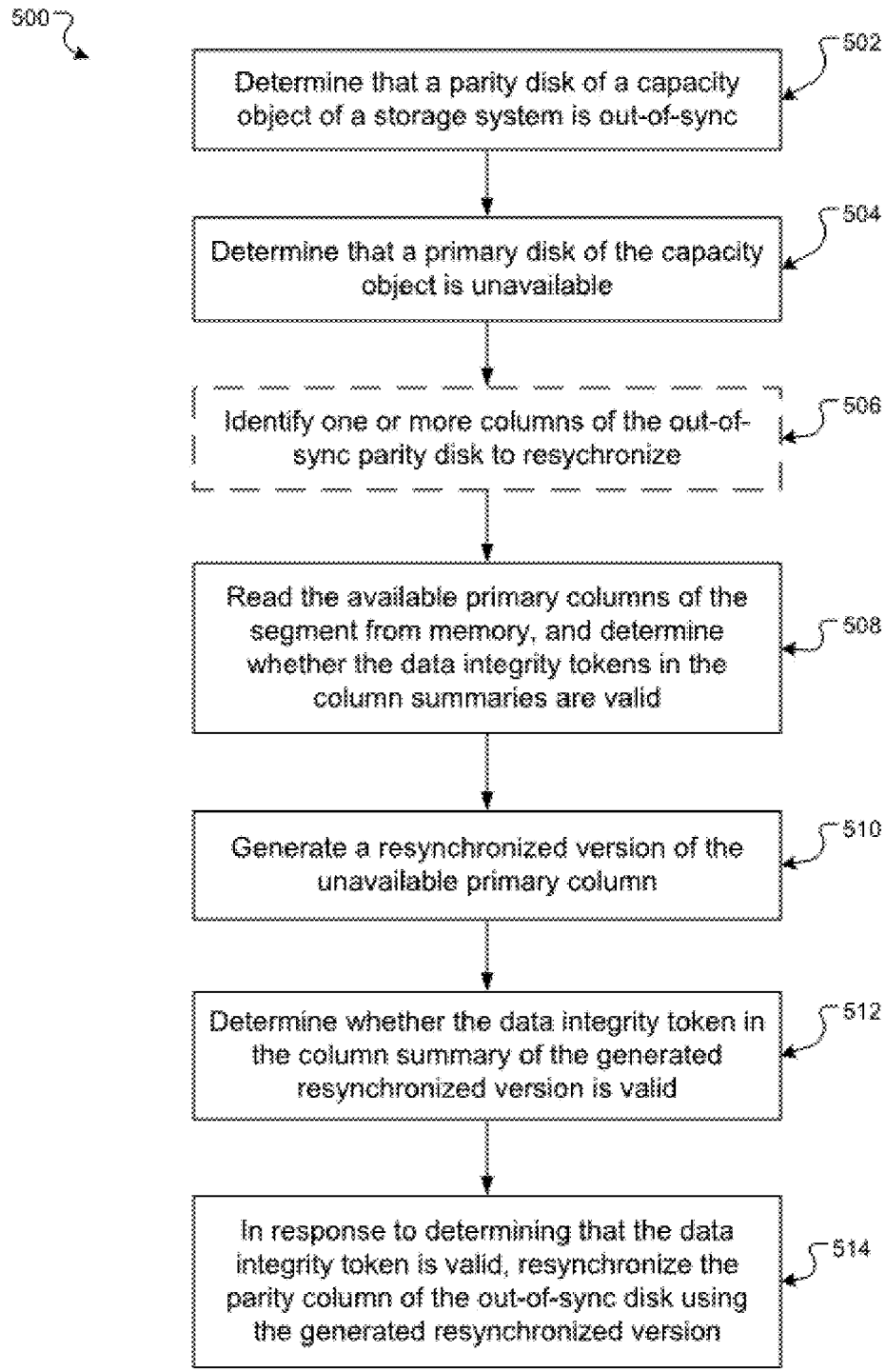
FIG. 5 is a flow diagram of an example process for resyncing a failed parity disk in a capacity object of a storage system.

FIG. 5 is a flow diagram of an example process 500 for resynchronizing an out-of-sync parity disk in a capacity object of a storage system when a primary disk of the capacity object is unavailable. For convenience, the process 500 will be described as being performed by a system of one or more computers located in one or more locations. For example, a data recovery subsystem of a storage system, e.g., the storage system 100 depicted in FIG. 1, appropriately programmed in accordance with this specification, can perform the process 500.

Each disk is segmented into multiple segments, where each segment of each primary disk includes a "segment summary" that includes a data integrity token, e.g., a CRC value, that corresponds to the data in the segment of the primary disk, e.g., as describe above with respect to FIG. 3A.

The system determines that a parity disk of the capacity object of the storage system is out-of-sync (step 502). The capacity object can include multiple primary disks and multiple parity disks. As a particular example, the capacity object can include a RAID-6 array that includes two parity disks. Thus, the capacity object can include primary disks A, B, C, and D, and parity disks P and Q. In such an example, the system can determine that parity disk P is out-of-sync.

The system determines that a primary disk of the capacity object is unavailable (step 504). Continuing the example described above, where the system has determined that parity disk P is out-of-sync, the system can determine that primary disk D is unavailable.

In this specification, a "column" of a disk refers to the portion of a disk that corresponds to a particular segment. Therefore, each segment has the same number of columns as the number of disks in the array. A column of a primary disk is called a primary column, while a column of a parity disk is called a parity column. In implementations in which the primary and parity disks are rotated between segments, a primary or parity column of a segment is a column of a disk that, for the segment, is being used as a primary or parity disk, respectively.

In some cases, the system might determine that the unavailable primary disk has incorrect or stale data even if the unavailable primary disk did not fail. For example, the system might determine that the unavailable primary disk has incorrect or stale data in the course of resynchronizing the out-of-sync parity disk. As a particular example, when the system determines that the parity disk is out-of-sync, the system might begin a standard resynchronization process whereby the system resynchronizes the parity disk using all of the primary disks. The system can read each of the primary disks and, before using them to resynchronize the parity disk, determine whether the data integrity tokens in the segment summaries of each of the primary disks are valid. If the system determines that all of the data integrity tokens are valid, the system can resynchronize the parity disk using the primary disks.

If the system discovers that one or more data integrity tokens of a primary disk are not valid, then the system can determine that the primary disk is not available to be used for resynchronization because it includes incorrect data. In these cases, the system can continue process 500 to resynchronize the out-of-sync parity disk. In some cases, the system can use the columns of the unavailable primary disk whose segment summaries do have valid data integrity tokens to continue with the standard resynchronization process, i.e., using the column and the corresponding columns in the other primary disks to resynchronize the corresponding column of the out-of-sync parity disk. That is, the system only continues the process 500 for the columns of the out-of-sync parity disk that are in the same segment as the columns of the unavailable primary disk whose segment summaries have invalid data integrity tokens. In some other implementations, the system determines not to use any column of the unavailable primary disk for resynchronizing the out-of-sync parity disk.

Optionally, the system identifies one or more columns of the out-of-sync parity disk to resynchronize (step 506).

In some implementations, the system uses a segment usage table of the storage system, e.g., the segment usage table 400 depicted in FIG. 4, to identify the one or more columns of the out-of-sync parity disk. In some cases, the data of the out-of-sync parity disk has been lost. In such cases, the system can use the segment usage table to determine which segments of capacity object have live data, and thus which columns of the out-of-sync parity disk have data that needs to be recovered. In some other cases, the out-of-sync parity disk went offline at a first time and came back online at a second time, and retains all of the data that was stored at the first time. In these cases, the system can use the segment usage table to determine which segments have been written to since the out-of-sync parity disk went offline (i.e., which segments have a transaction ID later than the first time), and thus which columns of the out-of-sync parity disk have stale data that needs to be resynchronized.

In some implementations, the system determines one or more columns of the unavailable primary disk for which the data integrity token in the segment summary of the column is incorrect, and then determines to continue the process 500 for those columns of the out-of-sync parity disk that are in the same segment as the determined columns of the unavailable primary disk.

In some implementations, the system determines to resynchronize every column of the out-of-sync parity disk.

The system can then execute steps 508 through 514 for each of the identified segments of the out-of-sync parity disk, i.e., for each identified out-of-sync parity column of the out-of-sync parity disk.

The system reads the available primary columns from memory, i.e., the primary columns of each primary disk except the unavailable primary disk, and determines whether the data integrity tokens in the column summaries are valid (step 508). That is, for each available primary column, the system can obtain the data of the available primary column and process the data to verify that the data matches the corresponding data integrity token. Continuing the example described above, where parity disk P is out-of-sync and primary disk D is unavailable, the system can read the primary columns of the segment from available primary disks A, B, and C, and determine whether the three respective data integrity tokens are valid.

If the system determines that each data integrity token is valid, then the system can continue with the process 500 and use the obtained available primary columns to resynchronize the out-of-sync parity column.

If the system determines that one or more of the data integrity tokens of the obtained available primary columns are invalid, then the system can determine that the data of the segment has been corrupted. That is, in this case, the segment includes i) the out-of-sync parity column, ii) the unavailable primary column, and iii) one or more other primary columns that have invalid data integrity tokens. Therefore, the system can determine that the data cannot be recovered, because a RAID-6 array has a fault tolerance of two disks, and the system has concluded that more than two disks contain invalid data.

The system generates a resynchronized version of the unavailable primary column using the available primary columns and a different parity column that is not the out-of-sync parity column (step 510). That is, the system can read the data from another parity column and use the read data, along with the available primary columns confirmed to be valid in step 508, to generate a resynchronized version of the unavailable primary column. Continuing the example described above, where parity disk P is out-of-sync and primary disk D is unavailable, the system can read the parity column of parity disk Q and use the parity column of parity disk Q and the primary columns of the available primary disks A, B, and C to generate a version of the unavailable column of primary disk D. This generated version is called D'.

The system determines whether the data integrity tokens in the column summary of the generated resynchronized version of the unavailable primary column is valid (step 512). That is, because parity columns do not have segment summaries but rather include parity values calculated from the segment summaries of the primary columns, the system cannot determine whether the data stored in the parity column used to generate the resynchronized version (in the above example, the parity column of disk Q) is valid. Therefore, the system determines that the version of the unavailable primary column D' is valid before proceeding with the process 500. If the system determines that the data integrity token of the generated resynchronized version of the unavailable primary column is valid, then the system can continue with the process 500 and use the generated version to resynchronize the out-of-sync parity column.

If the system determines that the data integrity token of the generated resynchronized version of the unavailable primary column is not valid, then the system can determine that the other parity column that is not the out-of-sync parity column contains incorrect data. In this case, the system can determine that the data of the segment has been corrupted and cannot be recovered. That is, in this case, the segment includes i) the out-of-sync parity column, ii) the unavailable primary column, and iii) another parity column that contains incorrect data, which exceeds the fault tolerance of the storage system.

The system resynchronizes the parity column of the out-of-sync parity disk using the generated resynchronized version of the unavailable primary column (step 514). That is, the system can use i) the generated resynchronized version of the unavailable primary column and ii) the available primary columns to resynchronize the out-of-sync parity column. Continuing the example described above, where parity disk P is out-of-sync and primary disk D is unavailable, the system can resynchronize the parity column of parity disk P using the primary columns of the available primary disks A, B, and C, and the generated resynchronized version D' of the unavailable primary disk D. That is, the system can generate parity values corresponding to A, B, C, and D' and place the generated parity values into parity disk P.

In some implementations, the system can also resynchronize the unavailable primary column using the generated resynchronized version of the unavailable primary column, i.e., resynchronize the primary disk D using D'. For example, if the unavailable primary disk is a disk that went offline but has come back online, or if the unavailable primary disk did not go offline but was determined to include incorrect data, the system can resynchronize the unavailable primary disk using D', that is, place the values of D' into the primary disk D. In some other implementations, the system can resynchronize the unavailable primary disk using a separate resynchronization process.

Note that the system did not immediately resynchronize the out-of-sync parity disk using the other parity disk and the available primary disks; that is, continuing the example, the system did not immediately resynchronize parity disk P using parity disk Q and primary disks A, B, and C. This is because the system cannot verify the validity of the data stored in the parity disk Q, because parity disks do not contain segment summaries. Therefore, the system first generates a version D' of the unavailable primary disk D whose validity the system can determine using the corresponding segment summary, and then uses D' to resynchronize P instead of using Q.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable processor, a computer, or multiple processors or computers. The apparatus can also be or further include special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices (also called solid state drives); NVMe devices, persistent memory, magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and pointing device, e.g, a mouse, trackball, or a presence sensitive display or other surface by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communications network. Examples of communications networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

In addition to the embodiments described above, the following embodiments are also innovative:

Embodiment 1 is a system comprising:
a capacity object comprising a plurality of segments, wherein each segment comprises:
 a plurality of primary columns each corresponding to a respective primary disk, wherein each primary column comprises a plurality of primary storage blocks and a column summary comprising a data integrity token derived from the primary storage blocks of the primary column; and
 a plurality of parity columns each corresponding to a respective parity disk, wherein each parity column comprises a plurality of parity storage blocks; and
a data recovery subsystem configured to resynchronize a particular disk that is out-of-sync when a primary disk that is different from the particular disk is unavailable, the resynchronization comprising, for each segment of one or more segments of the capacity object:
 generating a first version of the column of the segment corresponding to the unavailable primary disk using i) the primary columns of the segment corresponding to each available primary disk and ii) one or more parity columns of the segment corresponding to respective parity disks that are not the particular disk;
 determining whether the data integrity token in the column summary of the generated first version is valid; and
 in response to determining that the data integrity token is valid, resynchronizing the column of the segment corresponding to the particular disk using i) the primary columns of the segment corresponding to each available primary disk and ii) the first version of the column of the segment corresponding to the unavailable primary disk.

Embodiment 2 is the system of embodiment 1, wherein the particular disk is a parity disk of the plurality of parity disks of the capacity object.

Embodiment 3 is the system of any one of embodiments 1 or 2, wherein the unavailable primary disk is offline, has been offline, or has incorrect or stale data according to one or more invalid data integrity tokens corresponding to the unavailable primary disk.

Embodiment 4 is the system of any one of embodiments 1-3, wherein the resynchronization further comprises:
 determining that the particular disk is out-of-sync;
 beginning a resynchronization process for resynchronizing the particular disk; and during the resynchronization process, determining that the unavailable primary disk is unavailable.

Embodiment 5 is the system of embodiment 4, wherein determining that the unavailable primary disk is unavailable comprises determining that one or more first data integrity tokens corresponding to data originally stored in the unavailable primary disk are invalid.

Embodiment 6 is the system of any one of embodiments 1-5, wherein the resynchronization further comprises, for each segment of the one or more segments:
resynchronizing the column of the segment corresponding to the unavailable primary disk using the generated first version of the column.

Embodiment 7 is the system of any one of embodiments 1-6, wherein generating a first version of the column of the segment corresponding to the unavailable primary disk comprises, for each primary column of the segment corresponding to an available primary disk:
reading the primary column; and
determining whether the data integrity token in the column summary of the primary column is valid.

Embodiment 8 is the system of any one of embodiments 1-7, wherein the system further comprises a segment usage table identifying a list of particular segments of the storage subsystem that are currently in use, the segment usage table comprising, for each of the particular segments:
data identifying a previous segment in the linked list;
data identifying a next segment in the linked list;
data identifying a number of storage blocks of the particular segment that are currently in use; and
a transaction ID of the particular segment.

Embodiment 9 is a method comprising the operations of any one of embodiments 1-8.

Embodiment 10 is a computer storage medium encoded with a computer program, the program comprising instructions that are operable, when executed by data processing apparatus, to cause the data processing apparatus to perform the operations of any one of embodiments 1 to 8.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, the subject matter is described in context of scientific papers. The subject matter can apply to other indexed work that adds depth aspect to a search. In some cases, the actions recited in the claims can be performed in a different order and still achieve desirable results. In addition, the processes described do not necessarily require the particular order shown, or sequential order, to achieve desirable results. In certain implementations, multitasking and parallel processing can be advantageous.

What is claimed is:

1. A system comprising:
a capacity object comprising a plurality of segments, wherein each segment comprises:
a plurality of primary columns each corresponding to a respective primary disk, wherein each primary column comprises a plurality of primary storage blocks and a column summary comprising a data integrity token derived from the primary storage blocks of the primary column; and
a plurality of parity columns each corresponding to a respective parity disk, wherein each parity column comprises a plurality of parity storage blocks; and
a data recovery subsystem configured to resynchronize a particular disk that is out-of-sync when a primary disk that is different from the particular disk is unavailable, the resynchronization comprising, for each segment of one or more segments of the capacity object:
generating a first version of the column of the segment corresponding to the unavailable primary disk using i) the primary columns of the segment corresponding to each available primary disk and ii) one or more parity columns of the segment corresponding to respective parity disks that are not the particular disk;
determining whether the data integrity token in the column summary of the generated first version is valid; and
in response to determining that the data integrity token in the column summary of the generated first version is valid, resynchronizing the column of the segment corresponding to the particular disk using i) the primary columns of the segment corresponding to each available primary disk and ii) the first version of the column of the segment corresponding to the unavailable primary disk.

2. The system of claim 1, wherein the particular disk is a parity disk of the plurality of parity disks of the capacity object.

3. The system of claim 1, wherein the unavailable primary disk is offline, has been offline, or has incorrect or stale data according to one or more invalid data integrity tokens corresponding to the unavailable primary disk.

4. The system of claim 1, wherein the resynchronization further comprises:
determining that the particular disk is out-of-sync;
beginning a resynchronization process for resynchronizing the particular disk; and
during the resynchronization process, determining that the unavailable primary disk is unavailable.

5. The system of claim 4, wherein determining that the unavailable primary disk is unavailable comprises determining that one or more first data integrity tokens corresponding to data originally stored in the unavailable primary disk are invalid.

6. The system of claim 1, wherein the resynchronization further comprises, for each segment of the one or more segments:
resynchronizing the column of the segment corresponding to the unavailable primary disk using the generated first version of the column.

7. The system of claim 1, wherein generating a first version of the column of the segment corresponding to the unavailable primary disk comprises, for each primary column of the segment corresponding to an available primary disk:
reading the primary column; and
determining whether the data integrity token in the column summary of the primary column is valid.

8. A method comprising:
determining that a particular disk of a capacity object of a storage system is out-of-sync and that a primary disk that is different from the particular disk is unavailable, wherein the capacity object comprises a plurality of segments, and wherein each segment comprises:
a plurality of primary columns each corresponding to a respective primary disk, wherein each primary column comprises a plurality of primary storage blocks and a column summary comprising a data integrity token derived from the primary storage blocks of the primary column; and
a plurality of parity columns each corresponding to a respective parity disk, wherein each parity column comprises a plurality of parity storage blocks; and
for each segment of one or more segments of the capacity object:
generating a first version of the column of the segment corresponding to the unavailable primary disk using i) the primary columns of the segment corresponding to each available primary disk and ii) one or more parity columns of the segment corresponding to respective parity disks that are not the particular disk;
determining whether the data integrity token in the column summary of the generated first version is valid; and
in response to determining that the data integrity token is valid, resynchronizing the column of the segment corresponding to the particular disk using i) the primary columns of the segment corresponding to each available primary disk and ii) the first version of the column of the segment corresponding to the unavailable primary disk.

9. The method of claim 8, wherein the particular disk is a parity disk of the plurality of parity disks of the capacity object.

10. The method of claim 8, wherein the unavailable primary disk is offline, has been offline, or has incorrect or stale data according to one or more invalid data integrity tokens corresponding to the unavailable primary disk.

11. The method of claim 8, wherein determining that the particular disk is out-of-sync and that the unavailable primary disk is unavailable comprises:
determining that the particular disk is out-of-sync;
beginning a resynchronization process for resynchronizing the particular disk; and
during the resynchronization process, determining that the unavailable primary disk is unavailable.

12. The method of claim 11, wherein determining that the unavailable primary disk is unavailable comprises determining that one or more first data integrity tokens corresponding to data originally stored in the unavailable primary disk are invalid.

13. The method of claim 8, further comprising, for each segment of the one or more segments:
resynchronizing the column of the segment corresponding to the unavailable primary disk using the generated first version of the column.

14. The method of claim 8, wherein generating a first version of the column of the segment corresponding to the unavailable primary disk comprises, for each primary column of the segment corresponding to an available primary disk:
reading the primary column; and
determining whether the data integrity token in the column summary of the primary column is valid.

15. One or more non-transitory computer storage media encoded with computer program instructions that when executed by a plurality of computers cause the plurality of computers to perform operations comprising:
determining that a particular disk of a capacity object of a storage system is out-of-sync and that a primary disk that is different from the particular disk is unavailable, wherein the capacity object comprises a plurality of segments, and wherein each segment comprises:
a plurality of primary columns each corresponding to a respective primary disk, wherein each primary column comprises a plurality of primary storage blocks and a column summary comprising a data integrity token derived from the primary storage blocks of the primary column; and
a plurality of parity columns each corresponding to a respective parity disk, wherein each parity column comprises a plurality of parity storage blocks; and
for each segment of one or more segments of the capacity object:
generating a first version of the column of the segment corresponding to the unavailable primary disk using i) the primary columns of the segment corresponding to each available primary disk and ii) one or more parity columns of the segment corresponding to respective parity disks that are not the particular disk;
determining whether the data integrity token in the column summary of the generated first version is valid; and
in response to determining that the data integrity token is valid, resynchronizing the column of the segment corresponding to the particular disk using i) the primary columns of the segment corresponding to each available primary disk and ii) the first version of the column of the segment corresponding to the unavailable primary disk.

16. The non-transitory computer storage media of claim 15, wherein the particular disk is a parity disk of the plurality of parity disks of the capacity object.

17. The non-transitory computer storage media of claim 15, wherein the unavailable primary disk is offline, has been offline, or has incorrect or stale data according to one or more invalid data integrity tokens corresponding to the unavailable primary disk.

18. The non-transitory computer storage media of claim 15, wherein determining that the particular disk is out-of-sync and that the unavailable primary disk is unavailable comprises:

determining that the particular disk is out-of-sync;

beginning a resynchronization process for resynchronizing the particular disk; and during the resynchronization process, determining that the unavailable primary disk is unavailable.

19. The non-transitory computer storage media of claim 18, wherein determining that the unavailable primary disk is unavailable comprises determining that one or more first data integrity tokens corresponding to data originally stored in the unavailable primary disk are invalid.

20. The non-transitory computer storage media of claim 15, wherein the operations further comprise, for each segment of the one or more segments:

resynchronizing the column of the segment corresponding to the unavailable primary disk using the generated first version of the column.

21. The non-transitory computer storage media of claim 15, wherein generating a first version of the column of the segment corresponding to the unavailable primary disk comprises, for each primary column of the segment corresponding to an available primary disk:

reading the primary column; and determining whether the data integrity token in the column summary of the primary column is valid.

* * * * *